(12) United States Patent
Samoilov et al.

(10) Patent No.: US 8,405,115 B2
(45) Date of Patent: Mar. 26, 2013

(54) LIGHT SENSOR USING WAFER-LEVEL PACKAGING

(75) Inventors: Arkadii V. Samoilov, Saratoga, CA (US); Albert Bergemont, Palo Alto, CA (US); Chiung-C. Lo, Campbell, CA (US); Prashanth Holenarsipur, Fremont, CA (US); James Patrick Long, Gilroy, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 392 days.

(21) Appl. No.: 12/361,426

(22) Filed: Jan. 28, 2009

(65) Prior Publication Data

US 2010/0187557 A1 Jul. 29, 2010

(51) Int. Cl.
*H01L 33/00* (2010.01)

(52) U.S. Cl. ... 257/99; 257/415; 257/432; 257/E31.127; 438/64

(58) Field of Classification Search ............ 438/64; 257/99, 432, 415, 459, 414, E31.127, E29.324, 257/E31.11, E29.166, E33.066
See application file for complete search history.

(56) References Cited

U.S. PATENT DOCUMENTS

| | | | |
|---|---|---|---|
| 4,477,721 A * | 10/1984 | Chappell et al. | 257/82 |
| 5,102,829 A * | 4/1992 | Cohn | 29/837 |
| 5,122,669 A * | 6/1992 | Herring et al. | 250/370.14 |
| 5,241,133 A * | 8/1993 | Mullen et al. | 174/534 |
| 5,436,203 A * | 7/1995 | Lin | 29/841 |
| 5,578,525 A * | 11/1996 | Mizukoshi | 29/840 |
| 5,923,084 A * | 7/1999 | Inoue et al. | 257/712 |
| 6,034,429 A * | 3/2000 | Glenn et al. | 257/701 |
| 6,084,295 A * | 7/2000 | Horiuchi et al. | 257/690 |
| 6,268,654 B1 * | 7/2001 | Glenn et al. | 257/704 |
| 6,392,294 B1 * | 5/2002 | Yamaguchi | 257/690 |
| 6,503,780 B1 | 1/2003 | Glenn et al. | |
| 6,728,106 B2 * | 4/2004 | Kim | 361/719 |
| 6,759,266 B1 * | 7/2004 | Hoffman | 438/64 |
| 6,781,484 B2 * | 8/2004 | Matsuta | 333/193 |
| 6,853,046 B2 * | 2/2005 | Shibayama | 257/466 |
| 6,917,090 B2 | 7/2005 | Moden | |
| 6,949,822 B2 * | 9/2005 | Shivkumar et al. | 257/704 |
| 7,038,288 B2 * | 5/2006 | Lai et al. | 257/448 |
| 7,279,355 B2 * | 10/2007 | Lee et al. | 438/106 |
| 7,352,066 B2 * | 4/2008 | Budd et al. | 257/774 |
| 7,402,450 B2 * | 7/2008 | Ezaki et al. | 438/57 |
| 7,549,206 B2 * | 6/2009 | Higashi et al. | 29/592.1 |

(Continued)

OTHER PUBLICATIONS

D. Henry et al., "Through Silicon Vias Technology for CMOS Image Sensors Packaging", Electronic Components and Technology Conference, ECTC 2008; vol. 58; May 27-30, 2008; pp. 556-562.

(Continued)

*Primary Examiner* — N Drew Richards
*Assistant Examiner* — Ankush Singal
(74) *Attorney, Agent, or Firm* — North Weber & Baugh LLP

(57) ABSTRACT

The present invention provides systems, devices and methods for fabricating miniature low-power light sensors. With the present invention, a light sensitive component, such as a diode, is fabricated on the front side of a silicon wafer. Connectivity from the front side of the wafer to the back side of the wafer is provided by a through silicon via. Solder bumps are then placed on the back side of the wafer to provide coupling to a printed circuit board. The techniques described in the present invention may also be applied to other types of semiconductor devices, such as light-emitting diodes, image sensors, pressure sensors, and flow sensors.

21 Claims, 7 Drawing Sheets

U.S. PATENT DOCUMENTS

| | | | |
|---|---|---|---|
| 7,550,319 B2* | 6/2009 | Wang et al. | 438/125 |
| 7,700,399 B2* | 4/2010 | Yang et al. | 438/98 |
| 7,838,312 B2* | 11/2010 | Chiang | 438/26 |
| 2002/0111055 A1* | 8/2002 | Matsumura et al. | 439/91 |
| 2002/0149102 A1* | 10/2002 | Hashemi et al. | 257/706 |
| 2002/0181838 A1* | 12/2002 | Cunningham et al. | 385/16 |
| 2003/0034740 A1* | 2/2003 | Coll et al. | 315/111.21 |
| 2004/0041224 A1* | 3/2004 | Chao et al. | 257/444 |
| 2004/0129991 A1* | 7/2004 | Lai et al. | 257/433 |
| 2004/0198040 A1* | 10/2004 | Geefay et al. | 438/667 |
| 2005/0218488 A1* | 10/2005 | Matsuo | 257/678 |
| 2006/0006404 A1* | 1/2006 | Ibbetson et al. | 257/99 |
| 2006/0091293 A1* | 5/2006 | Grueger et al. | 250/208.6 |
| 2006/0108402 A1* | 5/2006 | Crisp et al. | 228/248.1 |
| 2006/0115128 A1* | 6/2006 | Mainguet | 382/115 |
| 2007/0236596 A1 | 10/2007 | Sekine et al. | |
| 2007/0273779 A1* | 11/2007 | Abe et al. | 348/294 |
| 2008/0094428 A1* | 4/2008 | Otis et al. | 347/1 |
| 2008/0135897 A1* | 6/2008 | Huang et al. | 257/292 |
| 2008/0170039 A1* | 7/2008 | Shin et al. | 345/170 |
| 2008/0191297 A1* | 8/2008 | Yang et al. | 257/432 |
| 2008/0308884 A1* | 12/2008 | Kalvesten | 257/414 |
| 2008/0315271 A1* | 12/2008 | Baek et al. | 257/292 |
| 2009/0051834 A1* | 2/2009 | Cottier | 349/14 |
| 2009/0066742 A1* | 3/2009 | Silverbrook et al. | 347/11 |
| 2009/0169035 A1* | 7/2009 | Rombach et al. | 381/175 |
| 2009/0283662 A1* | 11/2009 | Wu et al. | 250/206 |
| 2010/0187697 A1* | 7/2010 | Tsai et al. | 257/773 |

OTHER PUBLICATIONS

M. Puech et al., "Fabrication of 3D Packaging TSV using DRIE", Design, Test, Integration and Packaging (DTIP) of Mems & Moems; Apr. 9-11, 2008; pp. 109-114.

J. Yuan et al., "A Low-cost Through Via Interconnection for ISM WLP", Design, Test, Integration and Packaging (DTIP) of Mems & Moems; Apr. 9-11, 2008; pp. 115-118.

M. Motoyoshi, "Through-Silicon Via (TSV)", Proceedings of the IEEE, vol. 97, Issue 1, Jan. 2009; pp. 43-48.

Yong-Gon Kim et al., "Development Challenges for Ambient Light Sensor Packages", Electronic Components and Technology Conference, 2006; pp. 795-798.

"Avago Technologies' Low-Cost Ambient Light Photo Sensor in Miniature ChipLED Surface-Mount Package", Online White Paper, Jan. 2006; p. 10.

Office Action for Chinese Patent Application No. 20100000436.2, mailed on Oct. 10, 2011.

Office Action for Chinese Patent Application No. 20100000436.2, mailed on Sep. 19, 2012.

* cited by examiner

LIGHT SENSOR USING WAFER-LEVEL PACKAGING

BACKGROUND

A. Technical Field

The present invention relates generally to semiconductor light sensors, and more particularly to using various semiconductor fabrication and wafer level packaging techniques for fabricating miniature low power light sensors.

B. Background of the Invention

Light sensors are ubiquitous in modern society. Some applications use reflected light with optical detection for position sensing; these applications include bar code readers, laser printers and auto focusing microscopes. Other applications, such as digital cameras, cell phones and laptops, use optical sensors to gauge the amount of ambient light, and minimize the device's power consumption by regulating the intensity of the screen light as a function of the amount of the ambient light. Further, ambient-light sensors are integrated in laptops to adjust the screen's backlight to comfortable levels for the viewer. Light sensors may also be used in industrial applications.

Light sensors are typically implemented by fabricating a light-sensitive element, such as a diode, on the front side of a semiconductor wafer. In order to provide electrical or optical access, a traditional approach is to use wire bonding on the front side of the wafer. However, this approach requires significant semiconductor real estate and fan out resistance, resulting in a costly and high power consuming solution.

More recently, wafer level packaging ("WLP") for light sensors have provided smaller size, higher performance and some cost reduction over conventional approaches. Also, there have been efforts to utilize through silicon vias ("TSV"), via passivation layer deposition, pad oxide opening, via filling, redistribution layer ("RDL"), solder bump formation, and dicing in order to reduce the size and improve the performance. Etching processing used to fabricate TSVs have included wet etching, RIE (reactive ion etching) and DRIE (deep reactive ion etching.) These efforts have provided some improvements, but the semiconductor techniques are still challenged by cost and power effectiveness. What is needed is a solution for light sensors that provides significant improvements in the size, cost, power consumption, as well as reliability.

SUMMARY OF THE INVENTION

The present invention provides systems, devices and methods relating to miniature low-power light sensors. With the present invention, a light sensitive component, such as a diode, is fabricated on the front side of a silicon wafer. Connectivity from the front side of the wafer to the back side of the wafer is provided by TSVs. Solder bumps are placed on the back side of the wafer to provide coupling to a printed circuit board ("PCB"). This technique provides sensor miniaturization by eliminating the fan-out of the connections outside of the chip and achieves a preferred chip-size packaging. Further, the selection of solder bumps of specific dimensions may eliminate the need for underfill, e.g. filling of the space between the sensor chip and the PCB, and may result in cost-effective and reliable solutions.

The present invention may be implemented with a variety of different fabrication processes and techniques. For example, the TSVs may be fabricated with embodiments comprising DRIE via first, DRIE via last, via last wet etch, and a 2 step via structures. To further facilitate WLP, the front side of the wafer may be protected with a protective substrate or a protective tape.

The techniques described in the present invention may also be applied to other types of semiconductor devices, such as light-emitting diodes, image sensors, pressure sensors, and flow sensors.

Certain features and advantages of the present invention have been generally described in this summary section; however, additional features, advantages, and embodiments are presented herein or will be apparent to one of ordinary skill in the art in view of the drawings, specification, and claims hereof. Accordingly, it should be understood that the scope of the invention shall not be limited by the particular embodiments disclosed in this summary section.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

Figure ("FIG.") 1 illustrates the cross-section a via-first DRIE implementation of a semiconductor light sensor, according to various embodiments of the invention.

DETAILED DESCRIPTION OF THE PREFERRED EMBODIMENTS

Embodiments of the present invention provide systems, devices and methods relating to miniature low-power light sensors. The present invention achieves cost and reliability benefits with an efficient integration of Complementary Metal-Oxide-Semiconductor (CMOS) photo diode sensors, the use of TSVs for electrical connectivity, and the selection of solder bumps with certain characteristics. For the electrical connectivity, the invention employs TSVs that connect the light sensitive photo diodes and other devices on the front side to the back side of the die. On the back side of the die, solder bumps are located to facilitate connection with a printed circuit board, or other device. Using specially dimensioned solder bumps for wafer bumping eliminates the need for underfill, e.g. filling of the space between the chip and the PCB, and results in a cost-effective and reliable solution. Additionally, in order to ensure optical access to the sensor, the present invention employs an optical filter that may be placed above the light-sensitive element to select a required portion of the electromagnetic spectrum, such as visible light, for example, in order to mimic the human eye's perception of ambient light.

The invention may be implemented in a variety of semiconductor embodiments. Common etching processes include wet etching, Reactive-ion etch (RIE) and Deep reactive-ion etching (DRIE). Wet etching is a chemical process performed with liquid etchants and is strongly depended upon the exposed crystal face of the wafer. RIE is an etching technology used in microfabrication. It uses chemically reactive plasma to remove material deposited on wafers. The plasma is generated under low pressure (vacuum) by an electromagnetic field. High-energy ions from the plasma attack the wafer surface and react with it. DRIE is a highly anisotropic etch process used to create deep, steep-sided holes and trenches in wafers, with aspect ratios of typically 5:1 or more.

Figure 1:
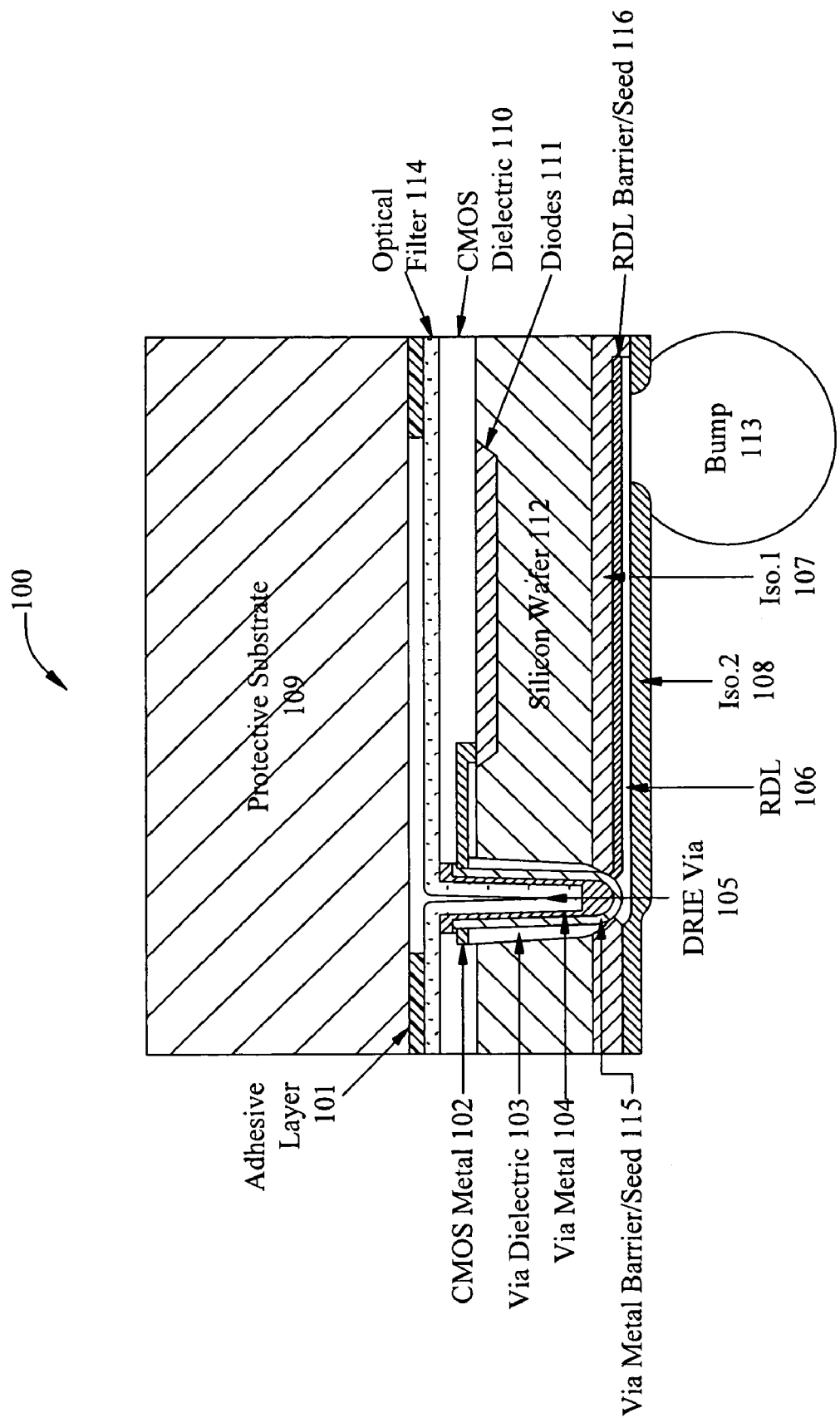

A first embodiment 100 is shown in FIG. 1, and is referred to as the via-first DRIE method, since the via is fabricated on the front (first) side of the silicon wafer 112. The embodiment 100 comprises the CMOS diode 111, CMOS dielectric 110, and CMOS metal 102. A layer on top of the CMOS elements is the optical filter 114, with properties as previously described. The DRIE via 105 includes the via metal 104, which is isolated from the silicon wafer by the via dielectric 103. In order to facilitate the processing on the back (second) side, a protective substrate 109 is attached to the front side of the wafer by an adhesive layer 101. In certain embodiments the via metal 104 is an electroplated metal which requires a via metal barrier/seed layer 115. In other embodiments the via metal 104 and the via metal barrier/seed layer 115 are replaced by a physical vapor deposition (PVD) metal layer.

The back side of the wafer comprises an isolation layer Iso.1 107, which provides insulation between the wafer and the subsequently deposited RDL layer 106. Above the RDL layer 106 and the wafer 112 is another isolation layer Iso2 108, and a solder bump 113 is located such that it is coupled to the RDL layer 106. In certain embodiments the RDL 106 is an electroplated metal which requires a RDL barrier/seed layer 116. In other embodiments the RDL 106 and the RDL barrier/seed layer 116 are replaced by a PVD metal layer.

In certain embodiments the diameter of the bump 113 is approximately 150 to 350 micrometers. When wafer level packaging processes utilizes a bump within this range of dimensions, there may be two positive results. First, the prior art requirement for underfill between the wafer 112 and the printed circuit board may be eliminated or reduced. Removal of the underfill requirement may result in a significant reduction in process complexity and cost. Second, connecting of the solder bump with the printed circuit board may be very reliable. Accordingly, end user products, like cell phones that utilize components with the present invention, may be very reliable and consequently may easily pass the required temperature cycling, vibration and drop tests.

As illustrated in FIG. 1, diodes 111 are coupled to the CMOS metal 102, which is coupled to the via metal 104, which is coupled to the RDL layer 106, which is coupled to the solder bump 113. Typically, the solder bump 113 is coupled to a printed circuit board. Thus, utilizing a TSV may provide space efficient connectivity from the diode 111 to a printed circuit board.

Figure 2:
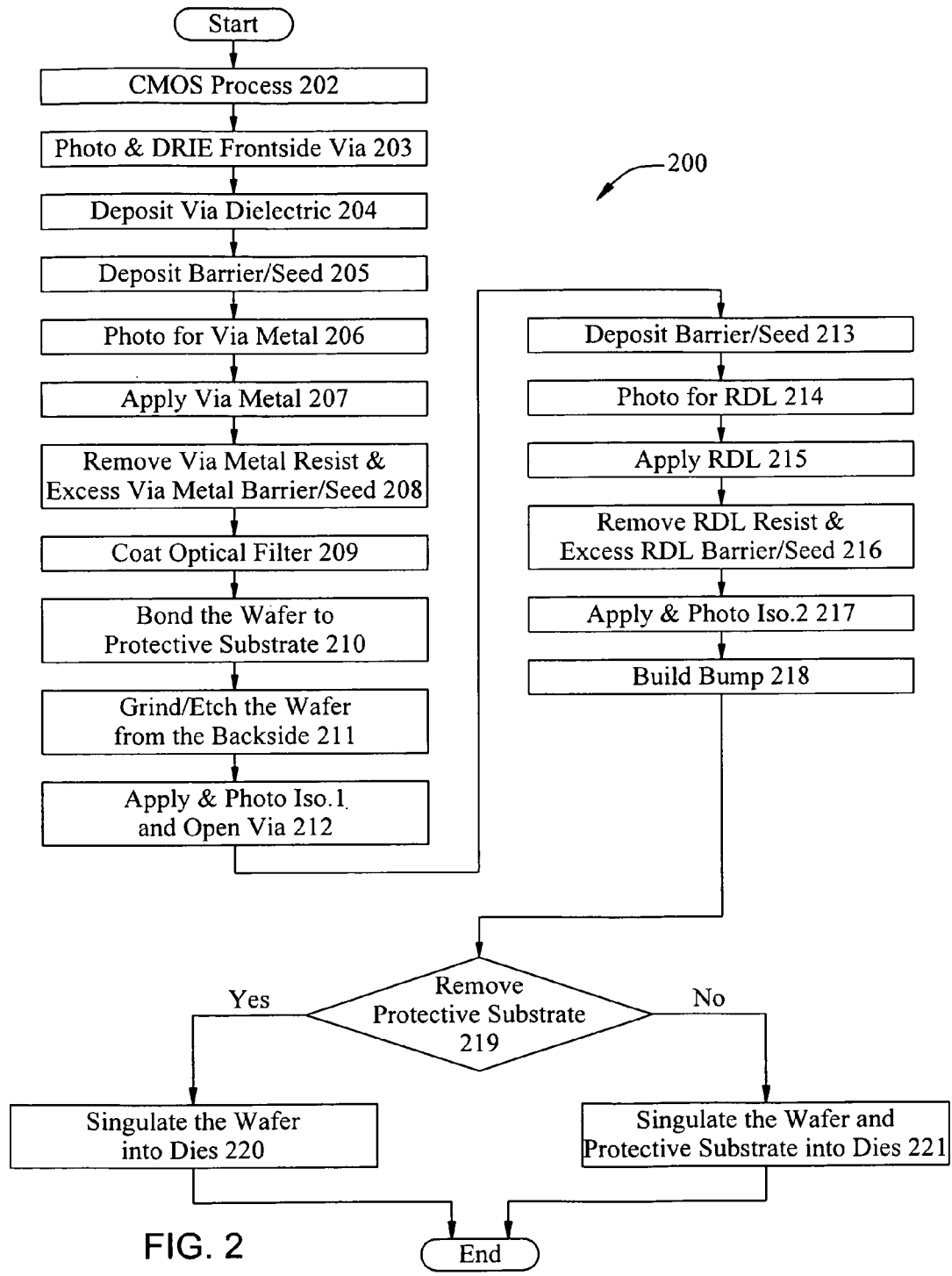
FIG. 2 illustrates a manufacturing method of a via-first DRIE implementation of a semiconductor light sensor, according to various embodiments of the invention.

The method 200 for fabricating a light sensor with a DRIE via-first TSV is illustrated in FIG. 2. The process begins with a CMOS process 202 wherein CMOS elements are fabricated on the front side of the wafer, such as diodes 111, CMOS dielectric 110, and CMOS metal 102. Then, the TSV is formed by patterning with a DRIE etch on the front side of a silicon wafer to generate DRIE via 105, as noted in step 203. The TSV is completed with the deposition of via dielectric 103 and patterned plating via metal 104 in steps of 204 to 208. The via metal 104 allows conductivity from the front side CMOS metal layer 102 to the back side of the wafer. In the next step 209, a layer of optical filter is deposited on the front side of the wafer. In the next step 210, the protective substrate 109 is attached with an adhesive 101 where the patterning of the adhesive 101 is optional.

After the protective substrate bonding 210, the wafer stack, comprising of the protective substrate 109 and the silicon wafer 112, is thinned down from the backside of silicon wafer through a two-step thinning process 211. The first step is a rough grinding with a conventional back grind tape attaching to the topside of protective substrate 109. The second step is a fine polish or etch to expose the bottom of the vias without damaging electrical and mechanical integrity of the TSVs.

The sequence of a photo-imaginable dielectric isolation layer Iso.1 107 deposition and via opening is conducted on the back (second) side of the wafer though lithography patterning and via dielectric etching. The dielectric isolation layer Iso.1 107 is coated, patterned, and cured on the backside of the wafer stack, per process step 212. The pattern of Iso.1 107 also serves as the etch mask during the via-opening RIE etch, per process step 212. The thick Iso.1 107 provides electrical isolation between RDL 106 and silicon wafer 112 and also provides mechanical strength for withstanding the stress transferred though solder bumps.

The RDL layer 106 is platted on the RDL barrier/seed 116 and is patterned in a thick photoresistor mold, per process steps of 213-215. After removing the photoresistor mold and the excess RDL barrier/seed 116, per process step 216, a dielectric isolation layer Iso.2 108 is coated, patterned, and cured on the backside of the wafer stack, per process step 217. Next, solder bump 113 is deposited on to the RDL 106. Numerous bumping processes and technologies are readily apparent to those skilled in the art. Removing the protective substrate 109 is optional in this embodiment, depending on whether one singulates the wafer into dies, or singulates the wafer and protective substrate 109 into dies. Refer to process steps 219, 220, and 221.

Bonding the protective carrier to the wafer facilitates the thinning process of the wafer and makes the TSV etch process easier. Typically the wafer is thinned to 50 to 300 micrometers. However, when this technique is used with the prior art method of front side wafer bonding, additional cost is incurred for the steps associated with wafer bonding and removal of the bonded wager at the end of the fabrication in order to expose the initial front surface of the sensor for light sensing purposes.

Figure 3:
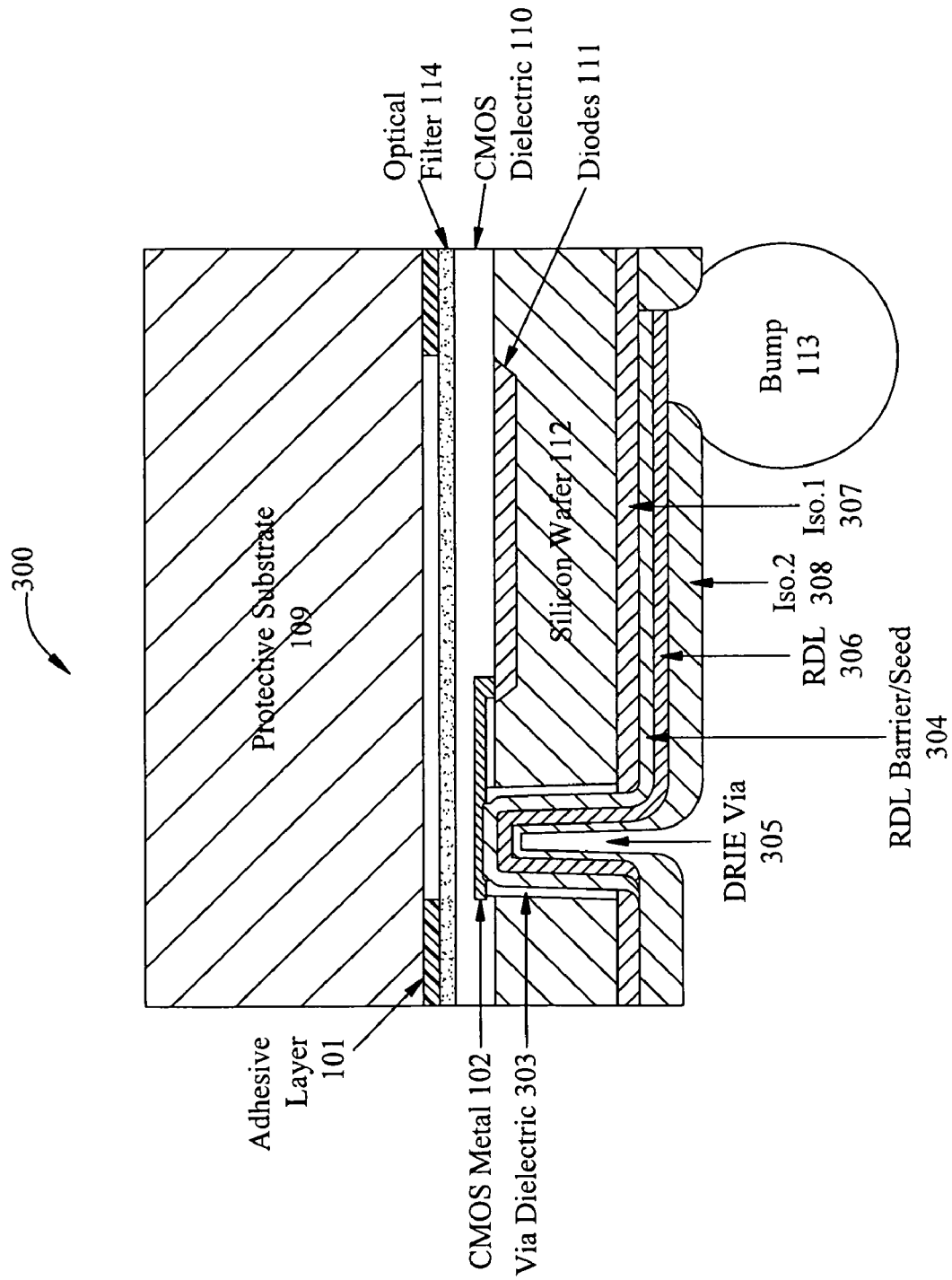
FIG. 3 illustrates the cross-section of a via-last DRIE implementation of a semiconductor light sensor, according to various embodiments of the invention.

The second embodiment 300 is shown in FIG. 3, and is referred to as the via-last DRIE method, since a via is fabricated on the back (second) side of the wafer. As illustrated in FIG. 3, DRIE via 305 provides connectivity from the front side to the back side of the silicon wafer 112. Note that DRIE via 305 structure is inverted relative to DRIE via 105 as illustrated in FIG. 1. However, embodiment 300 has many of the same structural elements as embodiment 100, and those elements provide the same functionality for the light sensor as the previous embodiment. Those elements comprise 101-104, 106-114, 116 per FIG. 1 and FIG. 3.

Figure 4:
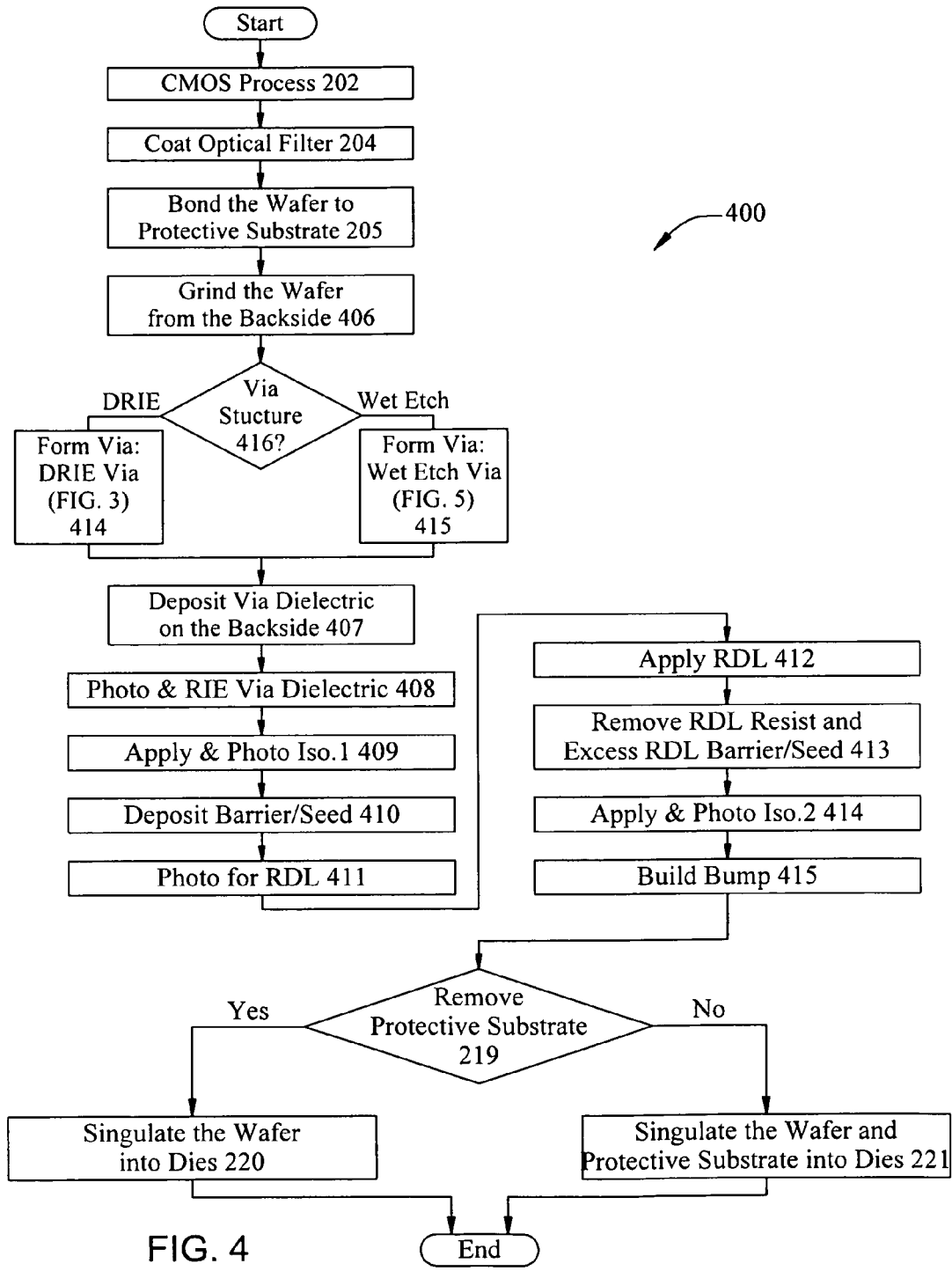
FIG. 4 illustrates a manufacturing method of a via-last DRIE and via-last wet etch implementation of a semiconductor light sensor, according to various embodiments of the invention.

The method 400 of fabricating a light sensor with a DRIE via-last TSV is illustrated in FIG. 4. The process begins with a CMOS process 202 wherein CMOS elements are fabricated on the front side of the wafer, such as diodes 111, CMOS dielectric 110, and CMOS metal 102. In the next step 204, a layer of optical filter is deposited on the front side of the wafer, before bonding to a protective substrate 109. The protective substrate 109 is attached with an adhesive 101, per step 205 in FIG. 4.

After the protective substrate bonding, the wafer stack, consisting of the protective substrate and the silicon wafer, is thinned down from the back side of silicon wafer. This method 406 comprises grinding with a conventional back grind tape attached to the topside of the protective substrate, with an optional polish or etching to better control the stack thickness and the surface condition.

To fabricate embodiment 300, a DRIE etch is selected in step 416. The TSVs are patterned and etched in DRIE on the backside of a silicon wafer per step 414. The sequence of via dielectric 303 deposition per step 407 and via opening is conducted with photoresistor patterning and via dielectric RIE etching per step 408. A special photoresistor coater is optional to enhance the uniformity across slopped via sidewalls. Next, the Iso.1 307 is coated, patterned, and cured on the back side of silicon wafer 112, per step 409. Then, a RDL 306 is then applied with a RDL barrier/seed 304. In certain embodiments the RDL 306 is an electroplated metal which requires a RDL barrier/seed layer 304. In other embodiments the RDL 306 and the RDL barrier/seed layer 304 are replaced by a PVD metal layer.

The RDL 306 couples the front side CMOS metal layer 102 to the wafer backside though the DRIE via 305, per steps 410-413. After removing the photoresistor mold and excess RDL barrier/seed layer, a dielectric isolation layer Iso.2 308 is coated, patterned, and cured on the backside of the wafer stack. As with method 200, the silicon wafer is solder bumped to facilitate coupling with a printed circuit board or other device. Similarly to the first embodiment 100, a selection is made to remove or not remove the protective substrate 109 before singulation of the wafer, per steps 219, 220, and 221.

Figure 5:
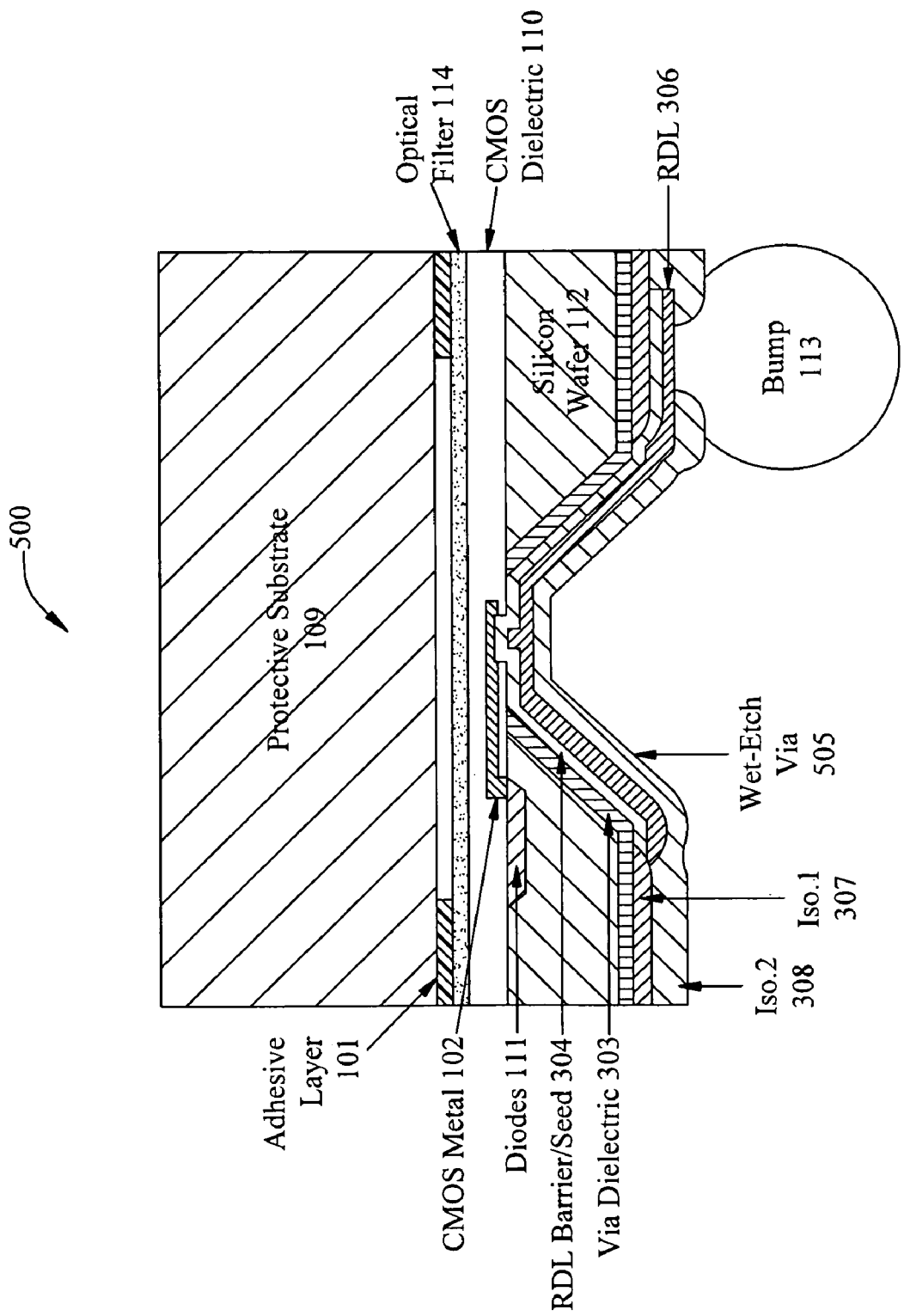
FIG. 5 illustrates the cross-section of a via-last wet etch implementation of a semiconductor light sensor, according to various embodiments of the invention.

The third embodiment 500 is shown in FIG. 5, and is referred to as the via-last wet etch method. As with embodiment 300, a via is fabricated on the back side of the wafer. However, instead of using a DRIE etch process, embodiment 500 utilizes a wet etch process. As illustrated in FIG. 5, wet etch via 505 provides connectivity from the front side to the back side of the silicon wafer 112, in an equivalent manner as DRIE via 305 as illustrated in FIG. 3. Further, embodiment 500 has many of the same structural elements as embodiments 100 and 300, and those elements provide the same functionality for the light sensor as the other embodiments. These embodiments comprise 101, 102, 109-114 per FIG. 1 and 303, 304, 306-308 per FIG. 3.

The method for fabricating embodiment 500 is illustrated by method 400 in FIG. 4. This is the same method as utilized to fabricated embodiment 300, except that the via is formed by a wet etch process per step 415. In this step, the TSVs are patterned and etched in wet-etching tank on the back side of a silicon wafer.

Figure 6:
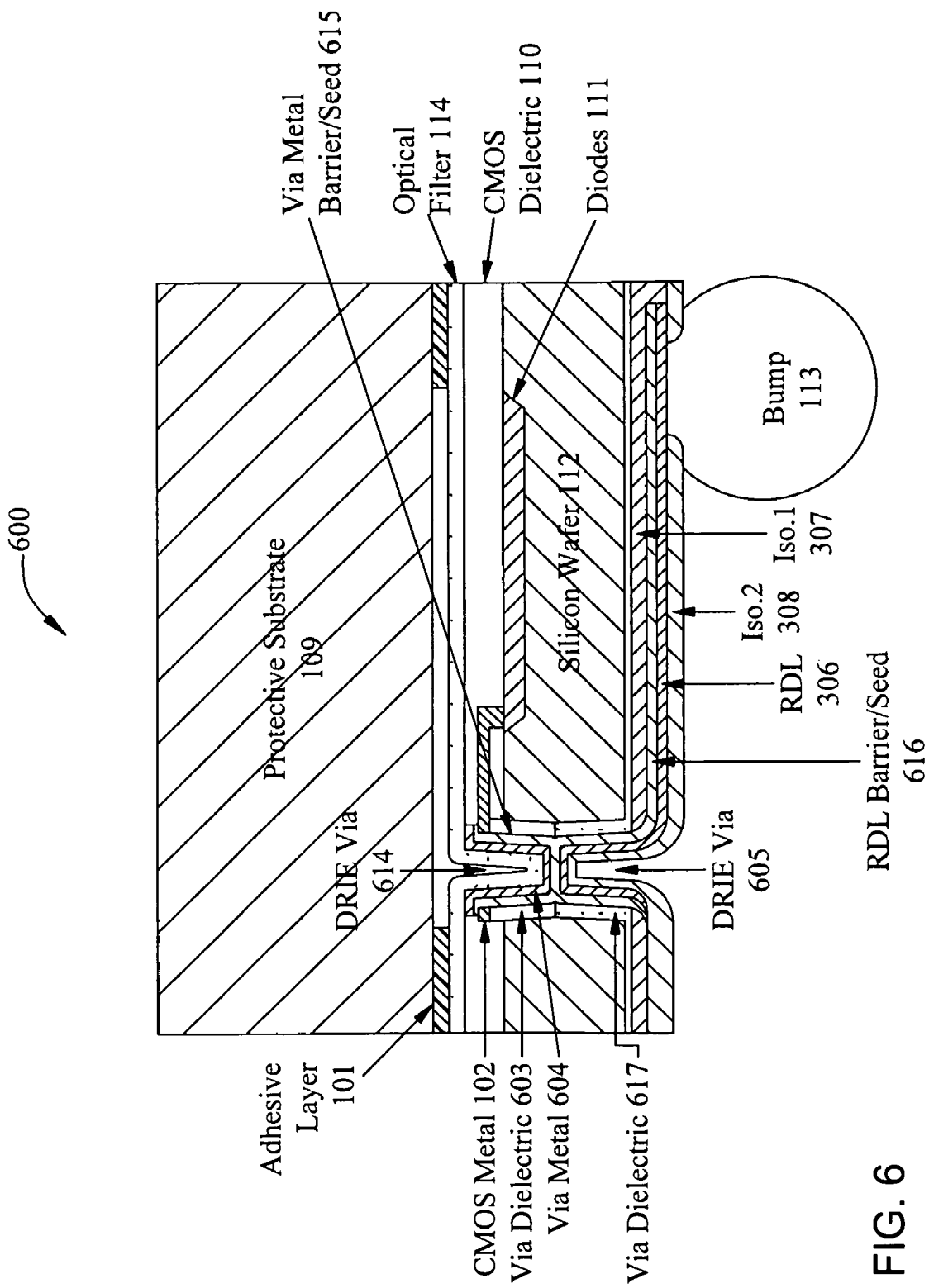
FIG. 6 illustrates the cross-section of a two-step through-silicon via implementation of a semiconductor light sensor, according to various embodiments of the invention.

The fourth embodiment 600 is shown in FIG. 6, and is referred to as the double-sided via or two-step via method, where there are two TSVs; one TSV is fabricated from the front side and another TSV is fabricated from the back side of the silicon wafer 112. As illustrated in FIG. 6, DRIE via portion 614 is located on the front side of silicon wafer 112, and a companion DRIE via portion 605 is located on the back side of the silicon wafer 112. DRIE via portions 605 and 614 are coupled together with their respective via metal layers in the middle portion of the silicon wafer 112. Further, as noted in FIG. 6, embodiment 600 has the same structural elements as embodiment 100, 300 and 500, and those elements provide the same functionality for the light sensor as the other embodiments. These embodiments comprise 101, 102, 109-114 per FIG. 1 and 306-308 per FIG. 3.

Figure 7:
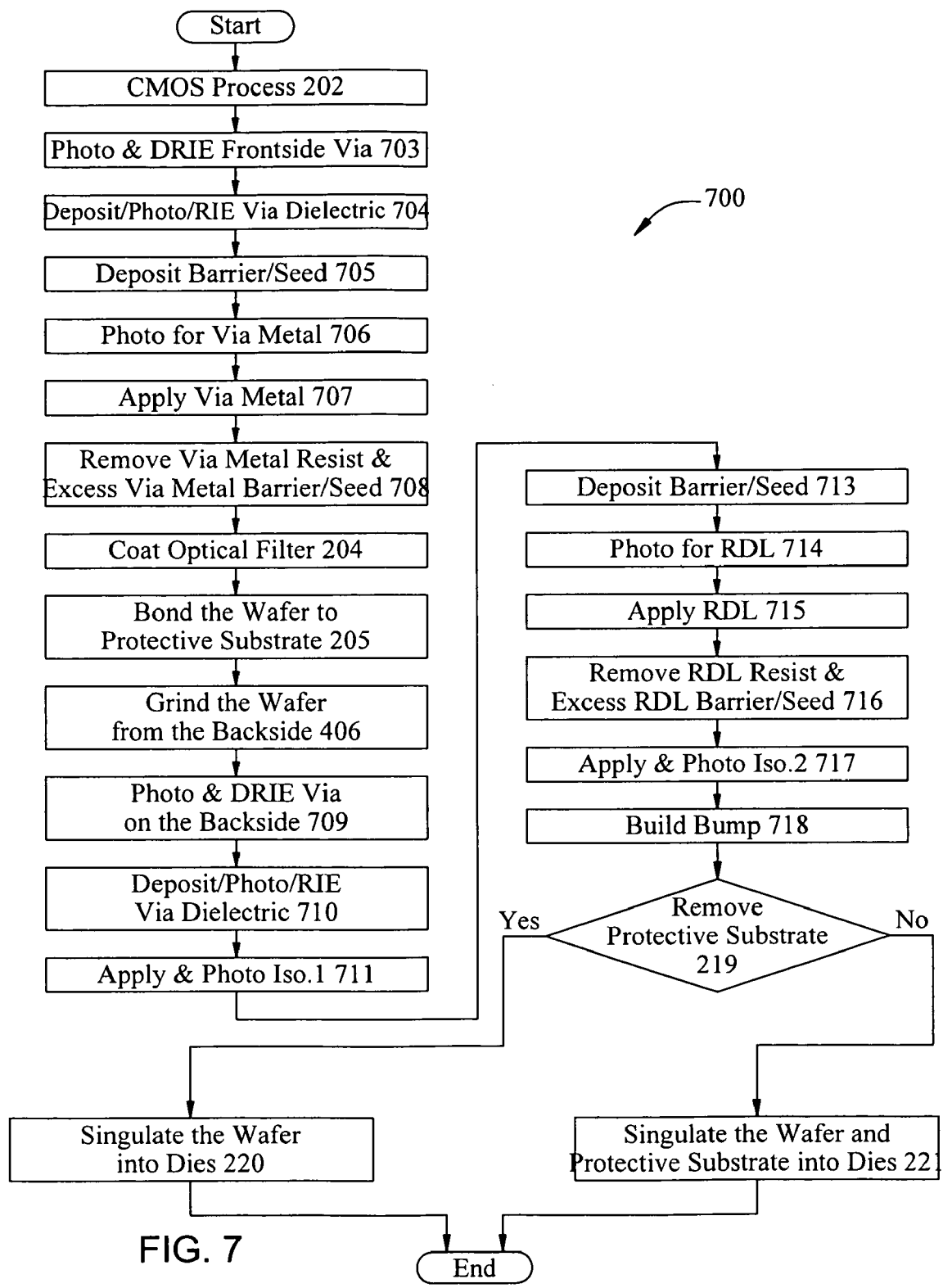
FIG. 7 illustrates a manufacturing method of a two-step through-silicon via implementation of a semiconductor light sensor, according to various embodiments of the invention.

The method 700 for fabricating a light sensor with a doubled-sided via is illustrated in FIG. 7. The process begins with a CMOS process 202 wherein CMOS elements are deposited on the front side of the wafer, such as diodes 111, CMOS dielectric 110, and CMOS metal 102. Then, the TSV is formed by patterning and etching with a DRIE etch on the front side of a silicon wafer to generate DRIE via portion 614, as noted in steps 703-708. The first part of TSV is completed with the deposition of via dielectric 603 and plating via metal 604. In the next step 204, a layer of optical filter is deposited on the front side of the wafer. Then a protective substrate 109 is attached with an adhesive 101 per step 205. After bonding the protective substrate 109, the wafer stack, consisting of the protective substrate 109 and the silicon wafer 112, is thinned down from the backside of the silicon wafer per step 406. A grinding with a conventional backgrind tape attached to the topside of the protective substrate 109 is conducted with an optional polish or etch to better control the stack thickness and the surface condition.

The second part of TSV is patterned and DRIE etched 605 on the back side of a silicon wafer per steps 709-710. The DRIE via 605 is formed by patterning and etching with a DRIE etch on the back side of a silicon wafer to generate DRIE via, as noted in step 709. The sequence of via dielectric deposition 617 and via opening is conducted with photoresistor patterning and via dielectric RIE etching. After coating, patterning, and curing the dielectric isolation layer Iso.1 307, a RDL is plated to couple the via metal layer 604 to the wafer back side per steps 713-715. In certain embodiments the RDL 306 is an electroplated metal which requires a RDL barrier/seed layer 616. In other embodiments the RDL 306 and the RDL barrier/seed layer 616 are replaced by a PVD metal layer. After removing the photoresistor mold and excess RDL barrier/seed layers, a dielectric Iso.2 layer 308 is coated, patterned, and cured on the backside of the wafer stack. As with methods 200 and 400, the silicon wafer 112 is bumped to facilitate coupling with a printed circuit board or other device. Removing the protective substrate is optional in this embodiment, as noted in step 219, 220, and 221.

In the aforementioned embodiments, the protective substrate 109 is attached with an adhesive layer 101. A special pressurized wafer holder or front side protection substrate is optional to protect circuitry during etching. The wafer holder and protection layers are readily apparent to those skilled in the art. An alternative method comprises attaching a protective tape to the front side of the wafer to protect the front side devices. For this method, a relatively small amount of silicon grinding takes place. The amount of remaining silicon wafer is in the range of approximately 400 micrometers up to the full initial wafer thickness of typically 730 micrometers.

Other embodiments may include fabrication of a light sensor on a substance other than a silicon wafer, for example a germanium wafer. It would be obvious to one skilled in the art that similar techniques for solder bumping and "through silicon vias" could be applied to other embodiments. Further, the light sensitive component may be a structure other than a silicon diode.

Alternative applications for the present invention may include light-emitting diodes, flow sensors, pressure sensors, and image sensor applications. Relative to flow and pressure sensors, a mechanism will be integrated on the semiconductor wafer that is capable of detecting a condition of being pressed; for example a force applied uniformly over a surface, measured as a force per unit area.

The foregoing description of the invention has been described for purposes of clarity and understanding. It is not intended to limit the invention to the precise form disclosed. Various modifications may be possible within the scope and equivalence of the appended claims.

We claim:

1. An integrated light sensor comprising:
   a semiconductor wafer having a first side and an opposing second side;
   a light-detecting diode fabricated on the first side of the wafer;
   a solder bump positioned on the second side of the wafer for connecting the wafer to a printed circuit board; and
   a via between the first side and the second side of the wafer, the via comprising a metal layer that is an unexposed, internal layer within the sensor and that is directly coupled to the light-detecting diode and that conducts electricity between the light-detecting diode and the solder bump.

2. The integrated light sensor of claim 1 wherein the wafer is a silicon wafer and the via is a through-silicon-via.

3. The light sensor as in claim 1 wherein the first side of the silicon wafers is protected by attaching either a protective substrate or by attaching a protective tape to the first side of the silicon wafer.

4. The light sensor as in claim 1 wherein the first side of the silicon wafer has an optical filter layer located above of the diode, the optical layer selectively filters electro-magnetic spectrum.

5. The light sensor as in claim 1 further comprising a plurality of diodes that are integrated on the silicon wafer to form a light sensor.

6. The light sensor as in claim 2 wherein the through-silicon-via is patterned and deep reactive ion etched from the first side to the second side of the silicon wafer.

7. The light sensor as in claim 2 wherein the through-silicon-via is formed by deep reactive ion etch from the second side to the first side of the silicon wafer.

8. The light sensor as in claim 6 wherein the through-silicon-via is formed by wet etching from the second side to the first side of the silicon wafer.

9. The light sensor as in claim 6 wherein the through-silicon-via is a two-step through-silicon-via manufactured by performing the steps comprising of:
   forming a first via portion on the first side of the silicon wafer using a first deep reactive ion etch;
   forming a second via portion on the second side of the silicon wafer using a second deep reactive ion etch; and
   depositing the via metal layer on a first surface of the first via portion and on a second surface of the second via portion, the via metal layer providing an electrical connection between the diode and the solder bump.

10. A method for fabricating an integrated light sensor, the method comprising the steps of:
    fabricating a light-detecting diode on a first side of a silicon wafer;
    forming a through-silicon-via between the first side and a second side of the wafer;
    depositing a via metal layer on a surface of the through-silicon-via, the via metal layer being an unexposed, internal layer within the sensor and being directly coupled to the light-detecting diode and providing electrical connectivity between the diode and the second side of the wafer; and
    depositing a solder bump on the second side of the silicon wafer, the solder bump being electrically coupled to the diode through by the via metal layer.

11. A method of fabricating a light sensor as in claim 10 wherein the through-silicon-via is patterned and deep reactive ion etched from the first side to the second side of the silicon wafer.

12. A method of fabricating a light sensor as in claim 10 wherein the through-silicon-via is formed by deep reactive ion etch from the second side to the first side of the silicon wafer.

13. A method of fabricating a light sensor as in claim 10 wherein the through-silicon-via is formed by wet etching from the second side to the first side of the silicon wafer.

14. A method of fabricating a light sensor as in claim 10 wherein the through-silicon-via is a two-step through-silicon-via manufactured by performing the steps comprising of:
    forming a first via portion on the first side of the silicon wafer using a first deep reactive ion etch;
    forming a second via portion on the second side of the silicon wafer using a second deep reactive ion etch; and
    depositing the via metal layer on a first surface of the first via portion and on a second surface of the second via portion, the via metal layer providing an electrical connection between the diode and the solder bump.

15. A method of fabricating a light sensor as in claim 10 further comprising the step of bonding the wafer to either a protective substrate or a protective tape.

16. An integrated semiconductor device comprising:
    a wafer having a first side and an opposing second side;
    a semiconductor sensing element fabricated on the first side of the wafer;
    a solder bump positioned on the second side of the wafer for connecting the wafer to a board; and
    a via between the first side and the second side the wafer, the via comprising a metal layer that is an unexposed, internal layer within the sensor and that is directly coupled to a semiconductor sensing element integrated and deposited on a surface of the via and that conducts electricity between the semiconductor sensing element and the solder bump.

17. The integrated semiconductor device of claim 16, further comprising a pressure sensor.

18. The integrated semiconductor device of claim 16, further comprising an image sensor.

19. The integrated semiconductor device of claim 16, further comprising a flow sensor.

20. The integrated semiconductor device of claim 16, further comprising a light-emitting diode.

21. The integrated semiconductor device of claim 16, wherein the solder bump has a diameter of 150-350 micrometers.

* * * * *